United States Patent
Lennhoff et al.

(10) Patent No.: US 6,838,013 B2
(45) Date of Patent: Jan. 4, 2005

(54) ETCHING PROCESS FOR MAKING ELECTRODES

(75) Inventors: Nancy S. Lennhoff, North Andover, MA (US); Jyothsna Ram, Shrewsbury, MA (US)

(73) Assignee: 3M Innovative Properties Company, St. Paul, MN (US)

( * ) Notice: Subject to any disclaimer, the term of this patent is extended or adjusted under 35 U.S.C. 154(b) by 177 days.

(21) Appl. No.: 10/170,105

(22) Filed: Jun. 12, 2002

(65) Prior Publication Data

US 2002/0182386 A1 Dec. 5, 2002

Related U.S. Application Data

(62) Division of application No. 09/570,310, filed on May 12, 2000, now Pat. No. 6,652,981.

(51) Int. Cl.⁷ .................................................. B44C 1/22
(52) U.S. Cl. ........................ 216/103; 216/108; 216/23; 156/345.11
(58) Field of Search ........................... 216/23, 95, 100, 216/101, 103, 108; 156/345.11; 428/472, 1.51, 333

(56) References Cited

U.S. PATENT DOCUMENTS

| | | | |
|---|---|---|---|
| 4,234,654 A | 11/1980 | Yatabe et al. | |
| 4,838,656 A | 6/1989 | Stoddard | |
| 5,293,546 A | 3/1994 | Tadros et al. | |
| 5,667,853 A | 9/1997 | Fukuyoshi et al. | |
| 5,750,267 A | 5/1998 | Takase et al. | |
| 5,861,064 A | * 1/1999 | Oikari et al. | 134/26 |
| 5,874,801 A | 2/1999 | Kobayashi et al. | |
| 5,911,899 A | 6/1999 | Yoshikai et al. | |
| 6,104,530 A | 8/2000 | Okamura et al. | |
| 6,249,082 B1 | 6/2001 | Fukuyoshi et al. | |
| 6,379,509 B2 | 4/2002 | Choi et al. | 204/192.29 |

FOREIGN PATENT DOCUMENTS

| | | |
|---|---|---|
| EP | 0265110 A | 4/1988 |
| EP | 0421429 A | 4/1991 |
| JP | 0660381 | 6/1995 |
| JP | 11282383 A | 10/1999 |

OTHER PUBLICATIONS

F. Krannig, "Chemical Etching of ITO Coatings", Applied Films Corporation, Boulder, Colorado, *Society of Vacuum Coaters*, pp. 226–229 (1996).

Patel, et al., Methods of monitoring & control of reactive ITO deposition process on flexible substrates with DC sputtering, Society of Vacuum Coaters 39$^{th}$ Annual Technical Conference Proceedings, 441–45 (1996).

Gibbons, et al., ITO Coatings for display applications, Society of Vacuum Coaters 40th Annual Technical Conference Proceedings, 216–220 (1997).

* cited by examiner

*Primary Examiner*—Parviz Hassanzadeh
(74) *Attorney, Agent, or Firm*—Stephen W. Buckingham

(57) ABSTRACT

Substantially transparent electrodes are formed on a substrate by a process including forming on the substrate, in order, a bottom high index layer, a metallic conductive layer, and a top high index layer with a conductivity of at least about 400 Ω/square; and chemically etching the bottom high index layer, the top high index layer and the conductive layer to form discrete electrodes in the metallic conductive layer.

15 Claims, No Drawings

ETCHING PROCESS FOR MAKING ELECTRODES

CROSS REFERENCE TO RELATED APPLICATIONS

This application is a divisional of application Ser. No. 09/570,310, filed May 12, 2000 now U.S. Pat. No. 6,652,981, the disclosure of which is incorporated by reference herein.

TECHNICAL FIELD

This invention relates to a wet etching process for patterning transparent electrodes for use in a display device.

BACKGROUND

U.S. patent application Ser. No. 09/009,391, now U.S. Pat. No. 6,379,509, incorporated herein by reference, describes a process for forming a plurality of substantially transparent electrodes on a substrate. This process comprises forming on the substrate, in order, a bottom high index layer, a metallic conductive layer, and a top high index layer having a conductivity of at least about 400 Ω/square. The top high index layer, the conductive layer and, optionally, the bottom high index layer, are patterned by laser ablation to form a plurality of discrete electrodes in the metallic conductive layer. The laser beam is scanned in a raster pattern over the substrate and modulated under the control of digital signals from a raster image processor. After the laser ablation procedure is completed, the electrode assembly is contaminated with surface residue and re-deposited debris. The surface of the assembly is then washed with an aqueous solution containing a surfactant and optionally gently abraded to remove the residue and debris.

SUMMARY

Ablative patterning of the top high index layer, the conductive layer, and, optionally, the bottom high index layer, of the electrode assembly is highly accurate and effective. However, such a process may not be appropriate for all materials and constructions. The high-resolution image file used in a laser ablation apparatus may not be required for all patterning operations. In addition, it may not be feasible to incorporate laser ablation equipment into an existing production facility.

In one aspect, the invention is a process for forming an electrode, the process including forming on a substrate, in order, a bottom high index layer, a conductive layer, and a top high index layer with a conductivity of at least about 400 Ω/square; and chemically etching the bottom high index layer, the top high index layer and the conductive layer to form an electrode in the conductive layer.

In another aspect, the invention is a substantially transparent electrode assembly including a substrate having deposited thereon, in order, a bottom high index layer, a metallic conductive layer, and a top high index layer with a conductivity of at least about 400 Ω/square. The conductive layer includes a plurality of discrete electrodes formed by chemically etching the bottom high index layer, the top high index layer and the conductive layer.

In yet another aspect, the invention is a display device including a substantially transparent electrode assembly. The electrode assembly includes a substrate having deposited thereon, in order, a bottom high index layer, a metallic conductive layer, and a top high index layer with a conductivity of at least about 400 Ω/square. The conductive layer includes a plurality of discrete electrodes formed by chemically etching the bottom high index layer, the top high index layer and the conductive layer.

In another aspect, the invention is an electronic device including this substantially transparent electrode assembly.

The details of one or more embodiments of the invention are set forth in the description below. Other features, objects, and advantages of the invention will be apparent from the description and the claims.

DETAILED DESCRIPTION

The substrate used in the process of the invention may be made from any material with sufficient mechanical integrity and a sufficiently smooth surface to permit the formation of electrodes thereon. The substrate, like the other layers of the electrode assembly, is preferably sufficiently transparent to allow its use in a liquid crystal display. Glass substrates may be used, but it is generally preferred that the substrate be made of a synthetic resin. Preferred resins for this purpose include, for example, polyether sulfones, poly(alkyl) acrylates, cellulose diacetate, polycarbonate, polyesters, high glass transition temperature (Tg) polycarbonate copolymers available from Lonza AG, Basel, Switzerland under the trade designation "POKALON HT," and poly(bis(cyclopentadiene) condensate)s, such as the material sold by Lonza AG, Basel, Switzerland under the trade designation "TRANSPHAN." This material is a film made of a polymer sold by Japan Synthetic Rubber Co. Ltd., Tokyo, Japan under the trade designation "ARTON," which is stated by the manufacturer to be of the formula:

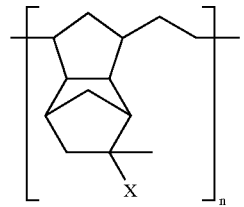

(in which X is a polar group).

The substrate may be coated on one or both surfaces to provide a barrier against gas and moisture, and/or to improve the hardness and scratch resistance of the substrate, and/or to improve the adhesion of the high index layer to the substrate. For example, a hard polymer may be coated on one surface or both surfaces of the substrate. Such a hard coating will typically have a thickness of from about 1 to about 15 μm, preferably from about 2 to about 4 μm. The coating may be polymerized by free radical polymerization (initiated either thermally or by ultra-violet radiation) of an appropriate polymeric material. An especially preferred hard coating is the acrylic coating sold under the trade designation "TERRAPIN" by Tekra Corporation, New Berlin, Wis.

A thin (typically 10–40 nm, preferably about 30 nm) layer of silica ($SiO_x$) may be applied on one or both surfaces of the substrate to act as a gas and moisture barrier for the eventual liquid crystal display assembly, and to act as an adhesion promoter to improve the adhesion of the bottom high index layer. The term "silica" is used herein means a material of the formula $SiO_x$ where x is not necessarily equal to two. These silica layers may be deposited by chemical vapor deposition or sputtering of silicon in an oxygen atmosphere, so that the material deposited does not precisely conform to the stoichiometric formula $SiO_2$ of pure silica. When both a hard coating and a silica layer are applied to the substrate, the layers may be applied in any order. In a preferred embodiment, a first silica layer is applied on a surface of the substrate, followed by, in order, a hard coating and a second silica layer.

In the present process, the following layers are deposited on the substrate, in order: a bottom high index layer, a metallic conductive layer and a top high index layer. A wide variety of techniques may be used to deposit these layers, for example, e-beam and thermal evaporation, but the layers are preferably deposited by sputtering or by chemical vapor deposition. A dc sputtering process is especially preferred, although RF, magnetron and reactive sputtering and low-pressure, plasma-enhanced and laser-enhanced chemical vapor deposition may also be used. When the preferred plastic substrates are used, each of the three layers should be deposited on the-substrate at a temperature not greater than about 170° C. to prevent damage to the plastic substrate. The temperature limit of course varies with the exact substrate material used. For example, for a TRANSPHAN substrate, the deposition temperature should not be greater than about 160 to about 165° C.

The bottom high index layer adjacent the substrate may be electrically insulating or conductive. Insulating materials are generally preferred, so if any portion of the bottom high index layer remains between adjacent electrodes after the patterning step, the remaining portion will not cause an electrical short between the electrodes. Such an electrical short is of course undesirable, since it in effect turns the two adjacent electrodes into a single electrode and adversely affects the quality of a liquid crystal display or touch screen in which the electrode assembly is used. However, a conductive high index layer may be used if the patterning conditions ensure that no portion of the bottom high index layer will remain after patterning.

Whether insulating or conductive, the bottom high index layer is typically formed from a metal oxide. Oxides that may be used for the bottom high index layer are indium oxide ($In_2O_3$), titanium dioxide ($TiO_2$), cadmium oxide (CdO), gallium indium oxide, niobium pentoxide ($Nb_2O_5$), and indium tin oxide (ITO). ITO is preferred. As is well known to those skilled in the art of forming electrodes for liquid crystal display assemblies (see, for example, Patel et al., Methods of monitoring and control of reactive ITO deposition process on flexible substrates with DC sputtering, Society of Vacuum Coaters 39th Annual Technical Conference Proceedings, 441–45 (1996), and Gibbons et al., ITO Coatings for display applications, Society of Vacuum Coaters 40th Annual Technical Conference Proceedings, 216–220 (1997)), the conductivity of such metal oxide layers can be controlled over several orders of magnitude by varying the conditions under which the oxide layer is deposited. For the preferred dc sputtering deposition process, the relevant conditions include temperature, reactor pressure, partial pressure of oxygen, dc bias and deposition rate. Doping may also be used to control the conductivity of the insulating layer. Typically, the thickness of the insulating layer will be about 20 to about 80 nm.

The refractive index needed in the bottom high index layer adjacent the substrate (and in the top high index layer) will vary somewhat depending upon the other layers present in the final apparatus in which the electrode assembly of the present invention is to be incorporated. In general, the refractive index of the high index layers, measured at 550 nm, will exceed 1.6, and the refractive indices of the preferred metal oxide high index layers can readily be made to exceed 1.9, as described in the papers mentioned above.

The conductive layer is made of any material capable of being deposited by the deposition process employed and having sufficient conductivity to provide the required low resistance in the final electrode assembly. Preferably, the conductive layer comprises a metal or a metal alloy, and most preferably the metal at least one of gold, silver and a gold/silver alloy (for example, the alloy described in U.S. Pat. No. 4,234,654). Since gold improves the corrosion resistance of the conductive layer, it is in general desirable that this layer comprise a layer of silver coated on one or both sides with a thinner layer of gold. For example, a 10 nm layer of silver sandwiched between two 1 nm layers of gold has been found to give good results. The overall thickness of the conductive layer will typically be in the range of about 5 to about 20 nm.

The preferred materials and processes for forming the top high index layer are the same as those for forming the bottom high index layer, except the conditions used to deposit the top layer should be varied to give the top layer substantial conductivity. The resistance of layers used in electrode assemblies is normally measured over the whole surface of the assembly, and a top high index layer with a conductivity of at least about 400 $\Omega$/square, and desirably from about 100 to about 200 $\Omega$/square, gives satisfactory results. The thickness of the top high index layer is preferably about 20 to about 100 nm.

Table 1 below list examples of combinations of bottom high index layers, conductive layers and top high index layers.

TABLE 1

| Bottom High Index Layer | Conductive Layer | Top High Index Layer |
| --- | --- | --- |
| ITO, 40 NM | Ag, 10 nm | ITO, 47 nm |
| ITO, 40–42 nm | Ag, 9–10 nm/Au, 1–1.5 nm | ITO, 47 nm |
| ITO, 40–42 nm | Au, 1 nm/Ag, 10 nm/Au 1 nm | ITO, 47 nm |
| $SnO_2$, 42 nm | Ag, 10–12 nm | ITO, 47 nm |
| $SnO_2$, 42 nm | Ag, 9–10 nm/Au, 1–1.5 nm | ITO, 47 nm |
| $SnO_2$, 42 nm | Au, 1 nm Ag, 10 nm/Au, 1 nm | ITO, 47 nm |

Following the deposition of the bottom high index layer, conductive and top high index layers, the top high index layer and the conductive layer are patterned using a wet etch process to form a plurality of discrete electrodes in the conductive layer. The patterning should preferably extend completely through both the top high index layer and the conductive layer to ensure that there are no short circuits between adjacent electrodes formed in the conductive layer. In practice, the patterning will usually extend completely through the bottom high index layer adjacent the substrate; however, as already indicated, it is preferred that the bottom high index layer have sufficient resistance to prevent unwanted current leakage between adjacent electrodes should any portion of the bottom high index layer remain after patterning.

In the wet etch process of the invention the substrate, which has applied thereon, in order, a bottom high index layer, a conductive layer, and a top high index layer, is treated in an etching bath. The wet etch process may include multiple steps, or may be performed in a single step. The composition of the etching bath may vary widely depending on the materials selected for the top and bottom high index layer and the conductive layer. Preferably, the composition of the etching bath should be selected to remove the bottom high index layer, the top high index layer and the conductive layer to form electrodes in the conductive layer.

For example, if the layers in the electrode construction utilize the materials in Table 1, and the bottom high index layer is ITO, the etching solution may include a first bath including $H_2SO_4$, a second bath including $FeCl_3$ and a third bath including $H_2SO_4$. The electrode construction would then be immersed first in the first $H_2SO_4$ bath to etch the top high index layer, next in the second $FeCl_3$ bath to etch the conductive layers, and third into the third $H_2SO_4$ bath to etch the bottom high index layer.

Preferably, however, the etch bath is a single bath including both $H_2SO_4$ to $FeCl_3$. The ratio of $H_2SO_4$ to $FeCl_3$ in the etching bath may vary widely depending on the solution temperature and residence time of the electrode construction in the solution. For example, assuming a substrate coated with the layer materials in Table 1, a stock solution of about 3% by weight concentrated 37% $H_2SO_4$ and about 0.01% by weight $FeCl_3$ may be prepared. These stock solutions may be combined in specific ratios by weight to create an appropriate etching solution. The ratio of the 3% $H_2SO_4$ stock solution to the 0.01% $FeCl_3$ stock solution should preferably range from about 1:1 to about 6:1, preferably about 2:1 to about 5:1, and most preferably about 4:1 to about 5:1.

The temperature of the etching solution may also vary widely, but an etching temperature slightly above room temperature is preferred to minimize the concentration of the components of the solution and the residence time required to achieve a satisfactory etch. Using the preferred components in the concentrations listed above, the temperature of the solution should preferably be about 20° C. to about 60° C., more preferably about 30° C. to about 40° C., and most preferably about 35° C. The temperature of the etching solution should preferably be maintained in a range of about ±5° C.

The residence time may also vary widely depending on the components in the etching solution, their concentration, and the temperature of the etching solution, but the residence time should be minimized as much as possible to allow use of the process in a production setting. Using the preferred components and temperatures above, the residence time should be about 1 minute to about 10 minutes, preferably about 3 minutes to about 5 minutes, and more preferably about 3.5 minutes to about 5 minutes.

The etching bath is preferably agitated to assist in the removal of residue from the electrode assembly. The bath may be agitated by any known technique, for example, with a stir bar or with ultrasonic agitation. Ultrasonic agitation with a frequency of about 40 to about 40 to about 50 kHz is preferred, and agitation at about 40 kHz is particularly preferred for the etching bath materials listed above.

The quality of the etch achieved with the above etching baths may be evaluated in several ways. The desired etch line width may be compared with the actual etch line width, and the etched lines may be visually inspected to determine the presence or absence of residue. In addition, the conductivity of the etched areas may be evaluated, with low conductivity indicating a more complete etch of the measured area.

After the etching process is complete, the sample may optionally be rinsed with water or another suitable cleaning solution to remove residue and clean the sample surface. Following this optional cleaning step, a plurality of conductors are attached to portions of the top high index layer overlying the discrete electrodes formed during the patterning step, so that these conductors make electrical contact with the electrodes via the conductive top layer. The electrode assembly thus formed may be for use in a passive type liquid crystal display, a touch screen display or other flat panel display.

It has been found that the electrode assemblies of the present invention can readily be formed having greater than about 80% transparency at 550 nm, and less than about 20 ohms per square sheet resistance. Such electrode assemblies are readily incorporated into display assemblies of commercial quality such as, for example, liquid crystal displays, touch screen displays, electroluminescent displays, and cholesteric displays. These displays may be used in a wide variety of electronic devices such as, for example, computers, telephones, pagers, hand held electronic organizers and the like.

EXAMPLES

An electrode assembly was prepared with the following layered structure, in order: hardcoat layer/TRANSPHAN substrate/hardcoat layer/30 nm SiOx/bottom high index layer of 38.5 nm ITO/conductive layer of 1 nm Au/8 nmAg/1 nm Au/top high index layer of 35 nm ITO. An experimental matrix was constructed that consisted of varying temperature, concentration ratio of $H_2SO_4$ (3%) and $FeCl_3$ (0.01%), and time, and evaluating the quality of the actual etch line width achieved compared to a desired (photoresist gap) etch line width. The temperatures studied were 30° C., 35° C. and 40° C.; the concentration ratios were, 2:1, 4:1 and 5:1; the residence times were 1 min, 3 min and 5 min. All the solutions were made from the same lot of $H_2SO_4$ (3%) and $FeCl_3$ (0.01%). The electrode assembly was etched in either a 40 or a 47 kHz ultrasonic unit.

A 2:1 ratio of $H_2SO_4$ (3%) to $FeCl_3$ (0.01%) proved to be too concentrated under the conditions of this example, and led to over etching regardless of temperature, time and ultrasonic bath frequency.

A 4:1 ratio of $H_2SO_4$ (3%) to $FeCl_3$ (0.01%) gave good results under some of the conditions of this example, but, at this ratio, the results of the etching process were very temperature and time sensitive.

For the 5:1 solution make up a 10 degree temperature variance did not seem to change the etch quality by a great deal (for the same time interval). The best results were found to be between 3.5 min and 5 min.

The optimum etch solution for the electrode assembly in this example was a 5:1 ratio of $H_2SO_4$ (3%) and $FeCl_3$ (0.01%). The solution should be monitored at 35±5° C. in an ultrasonic bath, and the conductor should be immersed for a residence time of 3.5 to 5 min. At these conditions we observe no over etching and no residue. Two different ultrasonic baths with frequencies of 40 kHz and 47 kHz were used and they both produced good results.

A number of embodiments of the invention have been described. Nevertheless, it will be understood that various modifications may be made without departing from the spirit and scope of the invention.

What is claimed is:

1. A process for forming an electrode, the process comprising:

forming on a substrate, in order, a bottom high index layer, a conductive layer, and a top high index layer with a conductivity of at least about 400 Ω/square; and chemically etching the bottom high index layer, the top high index layer and the conductive layer with an etching solution comprising $H_2SO_4$ and $FeCl_3$ to form an electrode in the conductive layer.

2. The process of claim 1, wherein the etching step is performed in a single bath comprising $H_2SO_4$ and $FeCl_3$.

3. The process of claim 2, wherein the bath comprises a 3% solution of $H_2SO_4$ and a 0.01% solution of $FeCl_3$ at a ratio of about 2:1 to about 5:1.

4. The process of claim 2, wherein the ratio in the bath is about 4:1 to about 5:1.

5. The process of claim 2, wherein the top and bottom high index layers and the conductive layer are resident in the bath for a residence time of about 1 minute to about 5 minutes.

6. The process of claim 2, wherein the top and bottom high index layers and the conductive layer are in the bath for a residence time of about 1 minute to about 5 minutes.

7. The process of claim 2, wherein the top and bottom high index layers and the conductive layer are in the bath for a residence time of about 3 minutes to about 5 minutes.

8. The process of claim 2, wherein the temperature of the bath is about 30° C. to about 40° C.

9. The process of claim 2, further comprising agitating the bath.

10. The process of claim 2, wherein the bath is an ultrasonic bath.

11. The process of claim 1, wherein the etching step forms a plurality of discrete electrodes in the conductive layer, further comprising connecting a plurality of conductors to portions of the top index layer overlying the discrete electrodes.

12. The process of claim 1, wherein the substrate is a material selected from the group consisting of polyether sulfones, poly(alkyl)acrylates, cellulose diacetate, polycarbonates, polyesters, polycarbonate copolymers and poly(bis(cyclopentadiene) condensate).

13. The process of claim 1, wherein the substrate further comprises a silica layer on at least one surface thereof.

14. The process of claim 1, wherein the substrate comprises on a surface thereof the following layers, in order: a first silica layer, a hardcoat layer, and a second silica layer.

15. A process for forming a substantially transparent electrode, the process comprising:

depositing on a substrate, in order, a bottom high index layer, a conductive layer, and a top high index layer with a conductivity of at least about 400 Ω/square, chemically etching in a single bath the bottom high index layer, the top high index layer and the conductive layer to form an electrode in the conductive layer, wherein the bath comprises $H_2SO_4$ and $FeCl_3$.

* * * * *

UNITED STATES PATENT AND TRADEMARK OFFICE
CERTIFICATE OF CORRECTION

PATENT NO. : 6,838,013 B2
DATED : January 4, 2005
INVENTOR(S) : Lennhoff, Nancy S.

It is certified that error appears in the above-identified patent and that said Letters Patent is hereby corrected as shown below:

Column 3,
Line 15, delete "the-substrate" and insert -- the substrate --.

Column 8,
Line 3, delete "poly(alkyl)acrylates" and insert -- poly(alky)acrylates --.

Signed and Sealed this

Twenty-fourth Day of May, 2005

JON W. DUDAS
*Director of the United States Patent and Trademark Office*